(12) United States Patent
Jaffari (10) Patent No.: US 9,614,530 B2
(45) Date of Patent: Apr. 4, 2017

(54) FAST FALL AND RISE TIME CURRENT MODE LOGIC BUFFER

(71) Applicant: SAMSUNG DISPLAY CO., LTD., Yongin, Gyeonggi-Do (KR)

(72) Inventor: Nasrin Jaffari, Sunnyvale, CA (US)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/877,869

(22) Filed: Oct. 7, 2015

(65) Prior Publication Data

US 2016/0173098 A1    Jun. 16, 2016

Related U.S. Application Data

(60) Provisional application No. 62/091,427, filed on Dec. 12, 2014.

(51) Int. Cl.
*H03K 19/0185* (2006.01)
(52) U.S. Cl.
CPC .................. *H03K 19/018528* (2013.01)
(58) Field of Classification Search
None
See application file for complete search history.

(56) References Cited

U.S. PATENT DOCUMENTS

| | | | |
|---|---|---|---|
| 5,006,739 A * | 4/1991 | Kimura | G09G 3/3688 327/111 |
| 5,107,145 A | 4/1992 | Kurashima | |
| 5,614,851 A * | 3/1997 | Holzer | G01R 19/04 327/50 |
| 6,028,459 A * | 2/2000 | Birdsall | G11C 27/026 327/94 |
| 6,130,550 A | 10/2000 | Zaliznyak et al. | |
| 6,144,234 A * | 11/2000 | Nakamura | G11C 27/026 327/92 |
| 6,492,840 B1 | 12/2002 | Bellaouar | |
| 6,897,697 B2 * | 5/2005 | Yin | H03K 3/356043 327/117 |
| 7,202,706 B1 * | 4/2007 | Plasterer | H03K 19/01707 326/115 |
| 7,271,626 B1 * | 9/2007 | Burinskiy | H02M 3/07 327/108 |
| 7,432,746 B2 | 10/2008 | Mao | |
| 7,755,421 B2 | 7/2010 | Chen et al. | |
| 7,847,600 B2 * | 12/2010 | Leslie | G11C 27/02 327/91 |

(Continued)

*Primary Examiner* — Crystal L Hammond
(74) *Attorney, Agent, or Firm* — Lewis Roca Rothgerber Christie LLP (57) ABSTRACT

A current mode logic buffer includes a differential pair of input transistors comprising a first input transistor and a second input transistor, a first output load resistor coupled in series with the first input transistor, a second output load resistor coupled in series with the second input transistor, a first output at a first node between the first output load resistor and the first input transistor, a second output at a second node between the second output load resistor and the second input transistor, a first hold capacitor configured to provide a semi-constant voltage source to the first output via a first low-resistance path, and a second hold capacitor configured to provide a semi-constant voltage source to the second output via a second low-resistance path.

20 Claims, 6 Drawing Sheets

(56) References Cited

U.S. PATENT DOCUMENTS

| | | |
|---|---|---|
| 7,919,985 B2 | 4/2011 | Green |
| 8,823,435 B2 | 9/2014 | Hairapetian |
| 2003/0107426 A1* | 6/2003 | Foroudi ............... H03K 5/003 327/333 |
| 2003/0141919 A1 | 7/2003 | Wang et al. |
| 2005/0248396 A1* | 11/2005 | Caresosa ........... H03F 3/45188 327/563 |
| 2006/0017468 A1* | 1/2006 | Azadet ............ H03K 19/09432 326/115 |
| 2008/0024172 A1* | 1/2008 | Yu ........................ H03F 1/483 326/115 |
| 2008/0024177 A1* | 1/2008 | Mao ............... H03K 19/018528 327/108 |
| 2008/0061837 A1* | 3/2008 | Xu ................. H03K 19/018528 326/127 |
| 2009/0302893 A1 | 12/2009 | Singh |
| 2012/0074987 A1* | 3/2012 | Piepenstock ... H03K 19/018528 327/108 |
| 2012/0326745 A1* | 12/2012 | Kothandaraman ................... H03K 19/094328 326/30 |
| 2013/0214865 A1* | 8/2013 | Bulzacchelli ......... H03F 1/0261 330/261 |

* cited by examiner

FAST FALL AND RISE TIME CURRENT MODE LOGIC BUFFER

CROSS-REFERENCE TO RELATED APPLICATION

This application claims priority to and the benefit of U.S. Provisional Application Ser. No. 62/091,427, filed Dec. 12, 2014, titled "Fast Fall and Rise Time Current Mode Logic Buffer," the entire content of which is incorporated herein by reference.

BACKGROUND

1. Field

Embodiments of the present invention relate to a buffer, and, more specifically, a current mode logic (CML) buffer with improved fall time and rise time characteristics.

2. Related Art

A logic buffer is a non-linear amplifier that is configured to map possible analog input voltages into one of two output voltages (e.g., an output signal corresponding to a logic signal of "low" or "high"). Current mode logic may be used for high-speed signal transmission and for circuit interfacing. Accordingly, high-performance CML buffers are widely accepted for various electronic applications, such as high-sped serial interfaces, because of the ability of CML buffers to achieve high speeds.

A CML buffer may be implemented as a differential pair amplifier with load resistors. The rise and fall times of the CML buffer, which may be respectively measured as an amount of time required for a signal to rise to 80% of the final output voltage, or to fall to 20% of the final output voltage, may be approximated as a function of resistance of the load resistors and a total load capacitance. For example, the rise and fall time of a Related Art CML buffer can be approximated as $1.6*R_{load}*C_{load}$, where $R_{load}$ is the resistance of the output load resistors, and $C_{load}$ is the total load capacitance.

In measuring the rise and fall time of a CML buffer, an eye diagram may be used to analyze the performance of the CML buffer, and may be constructed from a time-domain waveform by folding parts of the waveform corresponding to each individual bit into a single graph (e.g., the graph having a measured signal amplitude corresponding to a vertical axis, and having time corresponding to a horizontal axis).

The above information disclosed in this Background section is only to enhance the understanding of the background of the invention and therefore it may contain information that does not constitute prior art.

SUMMARY

A theoretically ideal buffer has an infinitesimal rise time/fall time (i.e., an instantaneous rise/fall time, or a rise time/fall time of zero). One potential drawback for implemented CML buffers may be unacceptably long rise and fall times. Accordingly, an improved CML buffer with shorter rise and fall times may provide benefit to various applications over Related Art CML buffers. Accordingly, aspects of embodiments of the present invention are directed to a CML buffer with faster rise and fall times than a Related Art CML buffer.

According to one or more embodiments of the present invention, there is provided a buffer, including a differential pair of input transistors including a first input transistor and a second input transistor, a first output load resistor coupled in series with the first input transistor, a second output load resistor coupled in series with the second input transistor, a first output at a first node between the first output load resistor and the first input transistor, a second output at a second node between the second output load resistor and the second input transistor, a first hold capacitor configured to provide a semi-constant voltage source to the first output via a first low-resistance path, and a second hold capacitor configured to provide a semi-constant voltage source to the second output via a second low-resistance path.

The buffer may further include a first PMOS transistor as the first low-resistance path and coupled in parallel with the first output load resistor, a second PMOS transistor coupled in parallel with the second output load resistor, a first NMOS transistor having a first electrode coupled to the first node, and a second NMOS transistor as the second low-resistance path and having a first electrode coupled to the second node, wherein the first hold capacitor is coupled between a second electrode of the first NMOS transistor and ground, wherein the second hold capacitor is coupled between a second electrode of the second NMOS transistor and ground, wherein the first input transistor, the first PMOS transistor, and the first NMOS transistor are configured to receive a common first input signal, and wherein the second input transistor, the second PMOS transistor, and the second NMOS transistor are configured to receive a common second input signal.

A first electrode of the first PMOS transistor may be coupled to the first node, a second electrode of the first PMOS transistor may be coupled to ground, a first electrode of the second PMOS transistor may be coupled to the second node, and a second electrode of the second PMOS transistor may be coupled to ground.

A first electrode of the first PMOS transistor may be coupled to a first voltage source, a second electrode of the first PMOS transistor may be coupled to the first node, a first electrode of the second PMOS transistor may be coupled to the first voltage source, and a second electrode of the second PMOS transistor may be coupled to the second node.

A first load capacitance may be coupled in series to the first output load resistor, and a second load capacitance may be coupled in series to the second output load resistor.

The buffer may further include a current minor transistor between a first voltage source and the differential pair of input transistors.

A first load capacitance may be coupled in parallel to the first output load resistor, and a second load capacitance may be coupled in parallel to the second output load resistor.

The buffer may further include a current mirror transistor between the differential pair of input transistors and ground.

A resistance of each of the first output load resistor and the second output load resistor may be at least about five times greater than an on-resistance of each of the NMOS and PMOS transistors.

A first load capacitance may be between the first node and ground, a second load capacitance may be between the second node and ground, and a capacitance of each of the first and second hold capacitors may be greater than a capacitance of each of the first and second load capacitances.

According to one or more embodiments of the present invention, there is provided a method of controlling a current mode logic (CML) buffer, the method including turning on a first PMOS transistor and a first input transistor to electrically couple a first hold capacitor to a first voltage source, charging the first hold capacitor to a voltage substantially equal to a final output voltage of a first output of the CML buffer through the first PMOS transistor and the first input transistor, sharing a charge between the first hold capacitor and a first load capacitance through the first PMOS transistor, and providing a first output voltage of a first value to the first output after the sharing of the charge.

The method may further include turning on a second NMOS transistor during the turning on of the first PMOS transistor and the first input transistor, and providing a second output voltage of a second value from a second voltage source to a second output of the CML buffer through the second NMOS transistor, wherein a logical value of the second output voltage of the second value is opposite to a logical value of the first output voltage of the first value.

The first voltage source may be ground.

The second voltage source may be ground.

The method may further include turning off the first input transistor and the first PMOS transistor, turning on a first NMOS transistor coupled between a second voltage source and the first output of the CML buffer, and providing the first output voltage of a second value from the second voltage source to the first output through the first NMOS transistor.

The method may further include turning off the second NMOS transistor during the turning off of the first input transistor and the first PMOS transistor, turning on a second PMOS transistor and a second input transistor during the turning on of the first NMOS transistor to electrically couple a second hold capacitor to the first voltage source, charging the second hold capacitor to a voltage substantially equal to a final output voltage of the second output through the second PMOS transistor and the second input transistor, sharing a charge between the second hold capacitor and a second load capacitance through the second PMOS transistor, and providing the first output voltage of the first value to the second output after the sharing of the charge.

The method may further include transmitting a first input signal to control the first PMOS transistor, the first input transistor, and the first NMOS transistor, and transmitting a second input signal that is a logical complement of the first input signal to control the second PMOS transistor, the second input transistor, and the second NMOS transistor.

According to one or more embodiments of the present invention, there is provided a current mode logic buffer including a first hold capacitor configured to receive a charge from a first voltage source through a first switch, and configured to share the charge with a first load capacitance through the first switch, a second hold capacitor configured to receive a charge from the first voltage source through a second switch, and configured to share the charge with a second load capacitance through the second switch, a third switch configured to couple a second voltage source to a first output of the CML buffer, and a fourth switch configured to couple the second voltage source to a second output of the CML buffer, wherein the first switch and the fourth switch are configured to be on when the second switch and the third switch are off.

The current mode logic buffer may further include a first load resistor between the second voltage source and the first output, and a second load resistor between the second voltage source and the second output.

The current mode logic buffer may further include a first input transistor between the first voltage source and the first output, and a second input transistor between the first voltage source and the second output.

BRIEF DESCRIPTION OF THE DRAWINGS

The accompanying drawings, together with the specification, illustrate exemplary embodiments of the present invention, and, together with the description, serve to explain the principles of the present invention, wherein.

DETAILED DESCRIPTION

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood- that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1A:
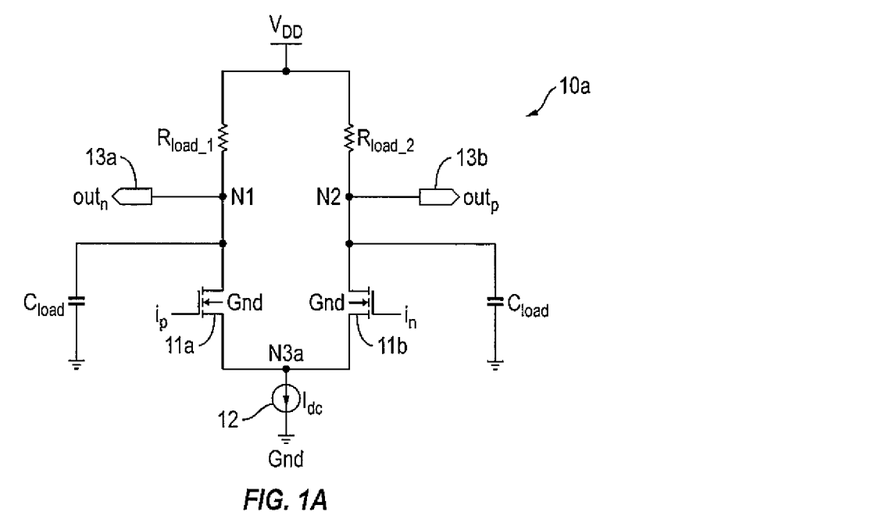
FIG. 1A illustrates a circuit diagram of a Related Art CML buffer that is referenced to a voltage source.
Figure 1B:
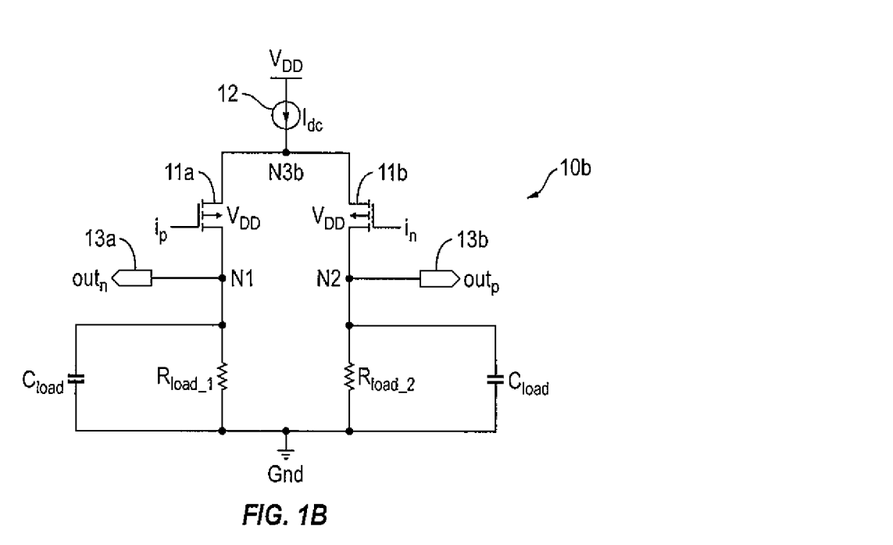
FIG. 1B illustrates a circuit diagram of a Related Art CML buffer that is referenced to ground.

FIG. 1A illustrates a circuit diagram of a Related Art CML buffer that is referenced to a voltage source, and FIG. 1B illustrates a circuit diagram of a Related Art CML buffer that is referenced to ground.

Referring to FIG. 1A, a rudimentary CML logic cell may include a CML buffer 10a. The Related Art CML buffer 10a may be implemented as a differential pair amplifier. The Related Art CML buffer 10a shown in FIG. 1A is referenced to a first voltage source $V_{DD}$, and includes a first PMOS input transistor 11a with an input configured to receive an input signal "$i_p$," and a second PMOS input transistor 11b with an input configured to receive an input signal "$i_n$." The input signals $i_p$ and $i_n$ to the PMOS input transistors 11a and 11b may be logical complements of each other (e.g., when $i_n$ has a "high" value or a value of "1," then $i_p$ may have a "low" value or a value of "0," and vice versa). The CML buffer 10a includes two output load resistors $R_{load\_1}$ and $R_{load\_2}$, and also includes a differential pair of outputs 13a and 13b respectively at nodes N1 and N2 and respectively configured to output signals "$out_n$" and "$out_p$." Performance of the CML buffer 10a depends on the resistance of the output load resistors $R_{load\_1}$ and $R_{load\_2}$, and also depends on a total capacitance, or effective capacitance $C_{load}$ of the load coupled to the buffer 10a. The CML buffer 10a in FIG. 1A is referenced to a voltage source $V_{DD}$, and has a tail current source 12 of current value $I_{dc}$ located between ground Gnd and a node N3a at which the input transistors 11a and 11b are coupled to each other.

Similarly, referring to FIG. 1B, a Related Art CML buffer 10b that is instead referenced to ground Gnd includes a first PMOS input transistor 11a configured to receive an input signal "$i_p$," a second PMOS input transistor 11b configured to receive an input signal "$i_n$," two output load resistors $R_{load\_1}$ and $R_{load\_2}$, and a differential pair of outputs 13a and 13b respectively at nodes N1 and N2 and respectively configured to output signals $out_n$ and $out_p$. Performance of the CML buffer 10b also depends on resistance of the output load resistors $R_{load\_1}$ and $R_{load\_2}$, and on a total capacitance/effective capacitance $C_{load}$ of the load connected to the buffer 10b. However, unlike the voltage source-referenced CML buffer 10a of FIG. 1A, the CML buffer 10b of FIG. 1B is referenced to ground Gnd. Accordingly, the CML buffer 10b has a tail current source 12 of current value $I_{dc}$ that is instead located between the voltage source $V_{DD}$ and a node N3b at which the differential pair of input transistors 11a and 11b are coupled. Furthermore, unlike the voltage source-referenced CML buffer 10a of FIG. 1A, the first and second load resistors $R_{load\_1}$ and $R_{load\_2}$ and the load capacitance $C_{load}$ of the ground-sourced CML buffer 10b are coupled in parallel, instead of being coupled in series.

Current-Mode Logic operates on switching the current $I_{dc}$ with the differential pair of input transistors 11a and 11b between the output load resistors $R_{load\_1}$ and $R_{load\_2}$. Depending on whether an input voltage differential (e.g., input voltage $i_p$–input voltage $i_n$) is positive or negative, more current is directed toward a corresponding one of the load resistors (e.g., $R_{load\_2}$) than toward the other one of the load resistors (e.g., $R_{load\_1}$). Accordingly, differential input signals $i_p$ and $i_n$ effectively determine currents through the output load resistors $R_{load\_1}$ and $R_{load\_2}$ and thereby determine an output voltage differential of the output signals $out_n$ and $out_p$ at the outputs 13a and 13b. Based on the output voltage differential, the output logic level is indicated (e.g., a logic level of "high," or "1," vs. a logic level of "low," or "0").

For example, when the differential input signals $i_p$ and $i_n$ are such that the input voltage difference $i_p$—$i_n$ is a positive potential (e.g., input $i_p$ is "high," and input $i_n$ is "low"), more current is driven toward a second load resistor $R_{load\_2}$ than toward a first load resistor $R_{load\_1}$, which in turn causes the voltage of the output signal $out_n$ to drop at a first output 13a while raising the voltage of the output signal $out_p$ at a second output 13b, thereby resulting in a positive voltage differential on the differential outputs 13a and 13b (e.g., $out_p$–$out_n$ is positive, which corresponds to a logic level of "high," or "1").

Although the CML buffers 10a and 10b of FIGS. 1A and 1B provide a method for converting a range of analog input voltages into one of two output voltages, the CML buffers 10a and 10b may provide insufficient operation at higher data rates due to a size of the load capacitance $C_{load}$ and an amount of resistance of the load resistors $R_{load\_1}$ and $R_{load\_2}$. Accordingly, embodiments of the present invention provide an improved CML buffer capable of faster rise and fall times.

Figure 2:
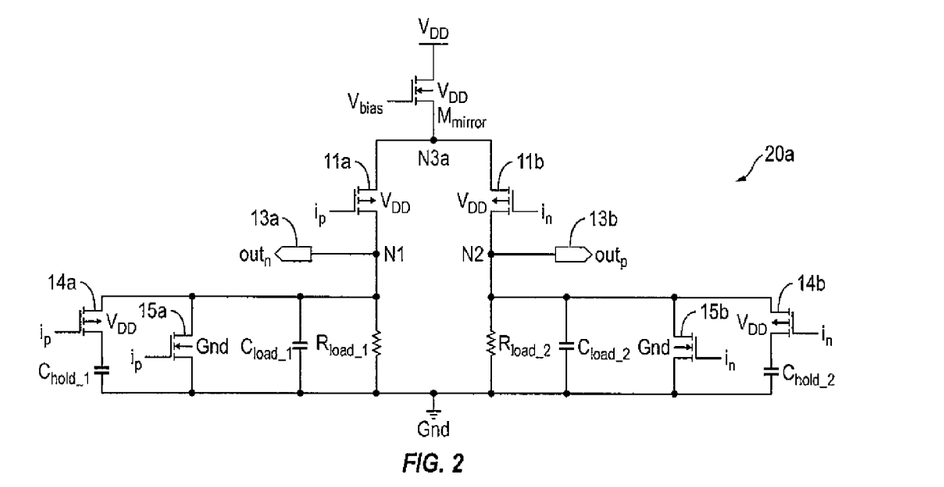
FIG. 2 illustrates a circuit diagram of a CML buffer that is referenced to ground, according to an embodiment of the present invention.

FIG. 2 illustrates a circuit diagram of a CML buffer that is referenced to ground, according to an embodiment of the present invention.

Referring to FIG. 2, the present embodiment provides a ground-sourced CML buffer 20a with significantly shorter rise and fall times when compared to a Related Art CML buffer (e.g., when compared to CML buffers 10a and 10b of FIGS. 1A and 1B). Like the ground-sourced CML buffer 10b of FIG. 1B, the CML buffer 20a of the present embodiment comprises a differential pair of input transistors (i.e., first input transistor 11a and second input transistor 11b), which are PMOS transistors that are configured to respectively receive differential input signals "$i_p$" and "$i_n$," a pair of load resistors (i.e., first load resistor $R_{load\_1}$ and second load resistor $R_{load\_2}$) respectively coupled in parallel with a first and second total load capacitance $C_{load\_1}$ and $C_{load\_2}$, and a differential pair of outputs including first output 13a, which is between the first input transistor 11a and the first load resistor $R_{load\_1}$ and is configured to output an output signal "$out_n$" and second output 13b, which is between the second input transistor 11b and the second load resistor $R_{load\_2}$ and is configured to output an output signal "$out_p$." However, unlike the Related Art ground-referenced CML buffer 10b of FIG. 1b, instead of including the tail current source 12 of current value $I_{dc}$, the CML buffer 20a of the present embodiment includes a current mirror transistor $M_{mirror}$ that receives a reference signal $V_{bias}$ at its gate. Additionally, the CML buffer 20a of the present embodiment includes a differential pair of PMOS transistors (i.e., first PMOS transistor 14a and second PMOS transistor 14b), and a differential pair of NMOS transistors (i.e., first NMOS transistor 15a and second NMOS transistor 15b), which are implemented as switches with low on-resistance, and which are part of low-resistance paths of the CML buffer 20a that are respectively used to achieve comparatively faster rise and fall times.

That is, the CML buffer 20a of the present embodiment may achieve improved rise and fall times by providing low-resistance paths (e.g., a rising resistance path used during a rising transition, and a falling resistance path used during a falling transition) to a semi-constant voltage source that has a voltage that is substantially equal to the desired final output voltage (e.g., a semi-constant voltage source having a voltage corresponding to an output voltage value of "high" or an output voltage value of "low"). For example, the rise/fall time of the CML buffer 20a of the present embodiment may be approximated by $1.6*R_{low}*C_{load}$, where the resistance $R_{low}$ of each of the low-resistance paths is significantly less than the resistance of each of the load resistors $R_{load\_1}$ and $R_{load\_2}$, thereby making the rise/fall time of CML buffer 20a of the present embodiment significantly less than the rise/fall time of the Related Art CML buffers 10a and 10b. The improved rise/fall time is due to the fact that alternative current paths (i.e., the low-resistance paths) of the CML buffer 20a of the present embodiment bypass the load resistors $R_{load\_1}$ and $R_{load\_2}$, unlike the current paths discussed with respect to Related Art CML buffers 10a and 10b.

The present embodiment uses a first low-resistance path between the outputs 13a or 13b and a respective hold capacitor $C_{hold\_1}$ and $C_{hold\_2}$ for the rising transition (e.g., a first low-resistance path through a respective one of the PMOS transistors 14a and 14b), and a second low-resistance path between the outputs 13a or 13b and ground Gnd for a falling transition (e.g., a second low-resistance path through a respective one of the PMOS transistors 15a and 15b). Each of the low-resistance paths include a switch (e.g., a respective one of the transistors 14a, 14b, 15a, and 15b) and a voltage source (e.g., a voltage source, such as ground Gnd, or a semi-constant voltage source, such as a respective one of the hold capacitors $C_{hold\_1}$ and $C_{hold\_2}$), wherein the corresponding switches are respectively controlled by the input signals $i_p$ and $i_n$ when the respective transition (e.g., the rising transition or the falling transition) is desired.

The voltage sources respectively corresponding to the low-resistance paths may either be a voltage source, such as ground Gnd, or a semi-constant voltage source, such as one of the hold capacitors $C_{hold\_1}$ and $C_{hold\_2}$ for holding a voltage that is equal to, or substantially equal to, the final output voltage of a rise transition (e.g., for holding a voltage corresponding to a "high" level).

In the present embodiment, first and second PMOS transistors 14a and 14b are PMOS transistors, and first and second NMOS transistors 15a and 15b are NMOS transistors. However, in other embodiments of the present invention, the transistors 14a and 14b may instead be NMOS transistors, and the transistors 15a and 15b may instead be PMOS transistors. Additionally, the inputs or gates of the first PMOS transistor 14a and the first NMOS transistor 15a are configured to receive the input signal $i_p$, and the inputs or gates of the second PMOS transistor 14b and the second NMOS transistor 15b are configured to receive the input signal $i_n$. In the present embodiment, the input signals $i_p$ and $i_n$ are logically complementary, and correspond to the input signals $i_p$ and $i_n$ respectively received by the gates of the first and second input transistors 11a and 11b.

Further, the resistance of each of the load resistors $R_{load\_1}$ and $R_{load\_2}$ may be, for example, about five times greater, or more, than the on-resistance of each of the PMOS transistors 14a and 14b and NMOS transistors 15a and 15b, thus enabling faster rise and fall times. Additionally, each of the first and second hold capacitors $C_{hold\_1}$ and $C_{hold\_2}$ is switchably coupled in parallel to a respective load capacitance $C_{load\_1}$ or $C_{load\_2}$ by a respective one of the PMOS transistors 14a and 14b, thereby enabling charge sharing between one of the hold capacitors $C_{hold\_1}$ and $C_{hold\_2}$ and a respective load capacitance $C_{load\_1}$ or $C_{load\_2}$.

Accordingly, if the voltage of the "high" logic signal of the CML buffer 20a is referred to as $V_{final}$, two types of transitions of note for the ground-referenced CML buffer 20a of the present embodiment are the transition from ground Gnd to $V_{final}$ (e.g., a rising transition), and the transition from $V_{final}$ to ground Gnd (e.g., a falling transition). Because the input signals $i_p$ and $i_n$ respectively received at the gates of the first and second input transistors 11a and 11b are logical complements of each other (i.e., if the $i_p$ signal is high, then the $i_n$ signal is low, and vice versa), the rising transition of the first output 13a occurs concurrently with the falling transition of the second output 13b. Operation of the CML buffer 20a according to the present embodiment will be discussed below.

A rising transition of the first output 13a of the CML buffer 20a of the present embodiment will be described. During the transition, voltages of the output signals $out_n$ and $out_p$ of the differential pair of outputs 13a and 13b change to raise the voltage of the first output signal $out_n$ while causing the voltage of the second output signal $out_p$ to fall, thereby resulting in a negative voltage differential on the differential outputs 13a and 13b (e.g., $out_p-out_n$ is negative, which corresponds to a logic level of "low," or "0"). Accordingly, the first output 13a of the CML buffer 20a undergoes a rising transition from ground to $V_{final}$, while the second output 13b of the CML buffer 20a undergoes a falling transition from $V_{final}$ to $_{the}$ t ground ($V_{final}$ being defined as $V_{high}$,).

Before the start of the rising transition at the first output 13a, the first NMOS transistor 15a is open, or is in an "on state," to electrically couple the first output 13a to the ground Gnd through the first NMOS transistor 15a. Furthermore, because the input signal $i_p$ received by the first NMOS transistor 15a is also delivered to the gates of the first PMOS transistor 14a and the first input transistor 11a, the first PMOS transistor 14a and the first input transistor 11a are closed, or are in an "off state," while the first NMOS transistor 15a is on. Accordingly, the first hold capacitor $C_{hold\_1}$ is floated, having one terminal coupled to ground, and another terminal coupled to the turned off first PMOS transistor 14a.

While the first PMOS transistor 14a and the first input transistor 11 a are off and the first NMOS transistor 15a is on, the floated first hold capacitor $C_{hold\_1}$ holds a voltage that is equal to, or substantially equal to, $V_{final}$, while the first output 13a is coupled to ground Gnd to produce a low output signal $out_n$. Additionally, because the first NMOS transistor 15a is on, both terminals of the effective capacitance of the load (e.g., first load capacitance $C_{load\_1}$) are coupled to ground Gnd, thereby causing the voltage across the first load capacitance $C_{load\_1}$ to be relatively small (e.g., about 0 volts).

Upon initiation of the rising transition of the first output 13a, an input signal $i_n$ is delivered to the gates of the transistors 11a, 14a, and 15a such that the first PMOS transistor 14a and the first input transistor 11a are turned on while the first NMOS transistor 15a is turned off. Accordingly, charge is shared between the first load capacitance $C_{load\_1}$ and the first hold capacitor $C_{hold\_1}$, such that a voltage across the first load capacitance $C_{load\_1}$ and the first hold capacitor $C_{hold\_1}$ become equal. Because the capacitance of the first hold capacitor $C_{hold\_1}$ is larger than that of the first load capacitance $C_{load\_1}$, and because of the low on-resistance of the first PMOS transistor 14a, charge sharing between the first load capacitance $C_{load\_1}$ and the first hold capacitor $C_{hold\_1}$ is able to occur relatively quickly, and the first hold capacitor $C_{hold\_1}$ is able to serve as a semi-constant voltage source corresponding to the first output 13a. Furthermore, because both the first PMOS transistor 14a and the first input transistor 11a are turned on, as the voltages of the first load capacitance $C_{load\_1}$ and the first hold capacitor $C_{hold\_1}$ are equalized through charge sharing, both may be concurrently charged to $V_{final}$ (e.g., $V_{high}$) by being coupled to the other voltage source $V_{DD}$ through the current mirror transistor $M_{mirror}$ and the first input transistor 11a.

The voltage across the first load capacitance $C_{load\_1}$ after the initial charge sharing between the first load capacitance $C_{load\_1}$ and the first hold capacitor $C_{hold\_1}$ may be referred to as $V_{load}$, which may be represented by the equation $V_{load}=\alpha V_{final}$, where $\alpha=C_{hold\_1}/(C_{hold\_1}+C_{load\_1})$. Accordingly, an output voltage of the output signal $out_n$ of the first output 13a reaches a value (e.g., $V_{load}$) that is close to the final output voltage $V_{final}$ (e.g., $V_{DD}$) quickly. However, due to the effective capacitance at the first output 13a of the CML buffer 20a being $C_{load}+C_{hold}$, the time required for the voltage of the first output 13a to reach $V_{final}$ from $\alpha V_{final}$ is relatively longer. Thus, during the rising transition, the transition of the first output 13a from Gnd to $\alpha V_{final}$ is relatively fast, while the transition of the first output 13a from $\alpha V_{final}$ to $V_{final}$ is slightly slower. However, because the first hold capacitor $C_{hold\_1}$ is floated by turning off the first PMOS transistor 14a after the first hold capacitor $C_{hold\_1}$ is coupled to the other voltage source $V_{DD}$, thereby charging the first hold capacitor $C_{hold\_1}$ as a semi-constant voltage source, $\alpha V_{final}$ may be more than 80% of $V_{final}$. Accordingly, the CML buffer 20a of the present embodiment is able to effectively achieve faster rise times than the Related Art CML buffer.

Because the input signals $i_p$ and $i_n$ respectively sent to the differential input transistors 11a and 11b are complementary, initiating a rising transition at the first output 13a will also initiate a falling transition at the second output 13b. With respect to the falling transition of the second output 13b to ground Gnd, the effective resistance that determines the transition time of the CML buffer 20a includes the on-resistance of the second NMOS transistor 15b, which is a relatively low resistance. Also, during the falling transition at the second output 13b, the effective capacitance at the second output 13b is the capacitance of the load (e.g., $C_{load\_2}$).

Accordingly, by providing the low-resistance paths between the voltage source (i.e., ground Gnd) and the first and second outputs 13a and 13b through the respective NMOS transistors 15a and 15b as an alternative to the paths between the voltage source Gnd and the outputs 13a and 13b respectively including the load resistors $R_{load\_1}$ and $R_{load\_2}$, a fall time of the falling transition of the CML buffer 20a of the present embodiment is comparatively reduced (e.g., when compared to the Related Art CML buffers 10a and 10b). For example, when the second NMOS transistor 15b is turned on, the second PMOS transistor 14b and the second input transistor 11b are turned off, the second output 13b is coupled to ground Gnd via the second NMOS transistor 15b, the load capacitance $C_{load\_2}$ is discharged, and the voltage at the second output 13b quickly approaches ground Gnd.

Similarly, by providing the low-resistance paths between the outputs 13a and 13b and respective ones of the hold capacitors $C_{hold\_1}$ and $C_{hold\_2}$ as semi-constant voltage sources (e.g., low-resistance paths through the first and second NMOS transistors 15a and 15b), a rise time of the rising transition of the CML buffer 20a of the present embodiment is comparatively reduced (e.g., when compared to the Related Art CML buffers 10a and 10b).

Figure 3:
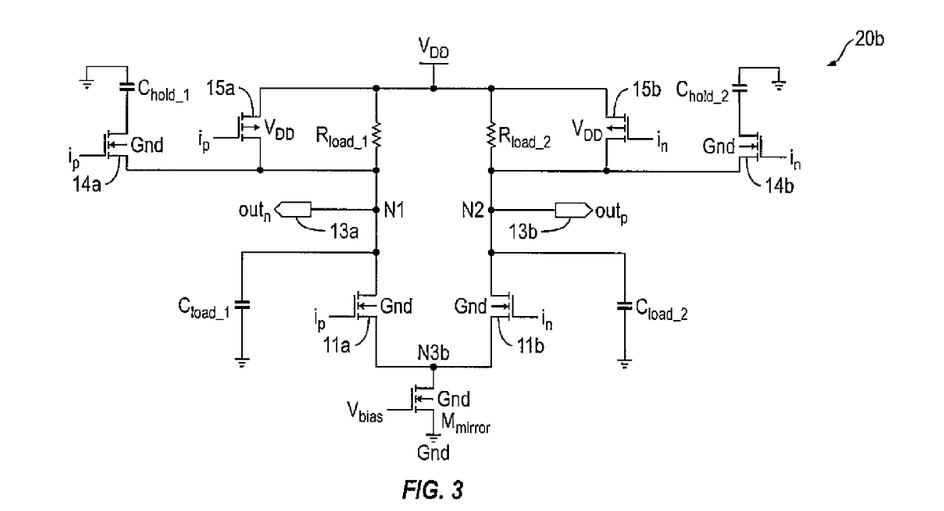
FIG. 3 illustrates a circuit diagram of a CML buffer that is referenced to a voltage source, according to an embodiment of the present invention.
Figure 4:
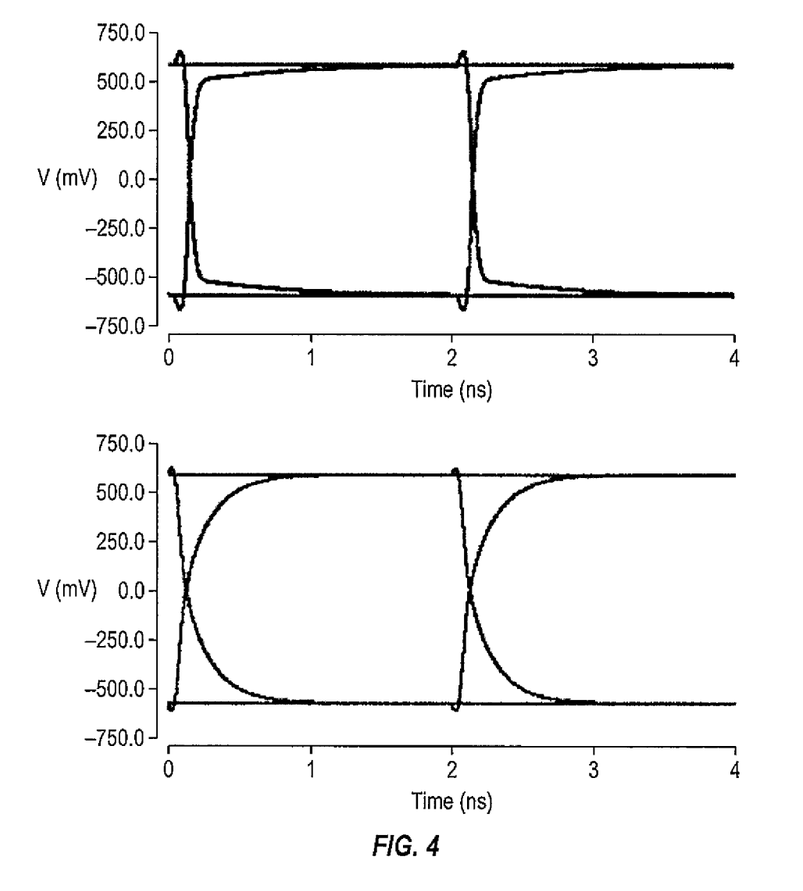
FIG. 4 illustrates eye diagrams comparing performance of a CML buffer of an embodiment of the present invention to performance of a Related Art CML buffer of a Comparative Example at a data rate of 0.5 gigabytes per second.
Figure 5:
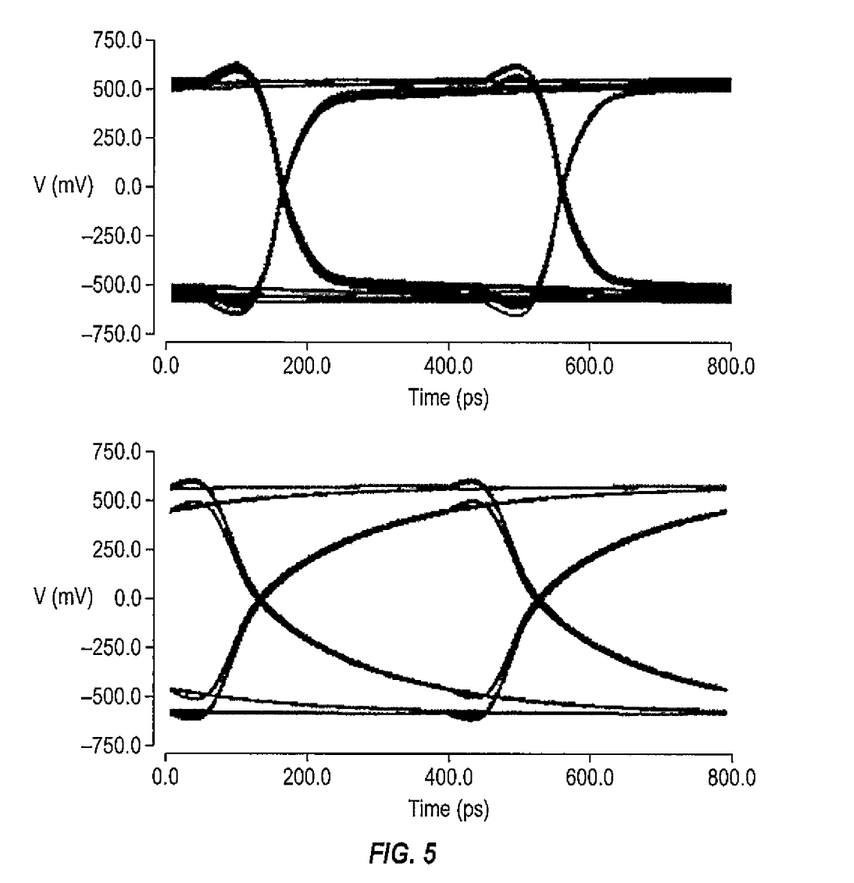
FIG. 5 illustrates eye diagrams comparing performance of a CML buffer of an embodiment of the present invention to performance of a Related Art CML buffer of a Comparative Example at a data rate of 2.5 gigabytes per second.
Figure 6:
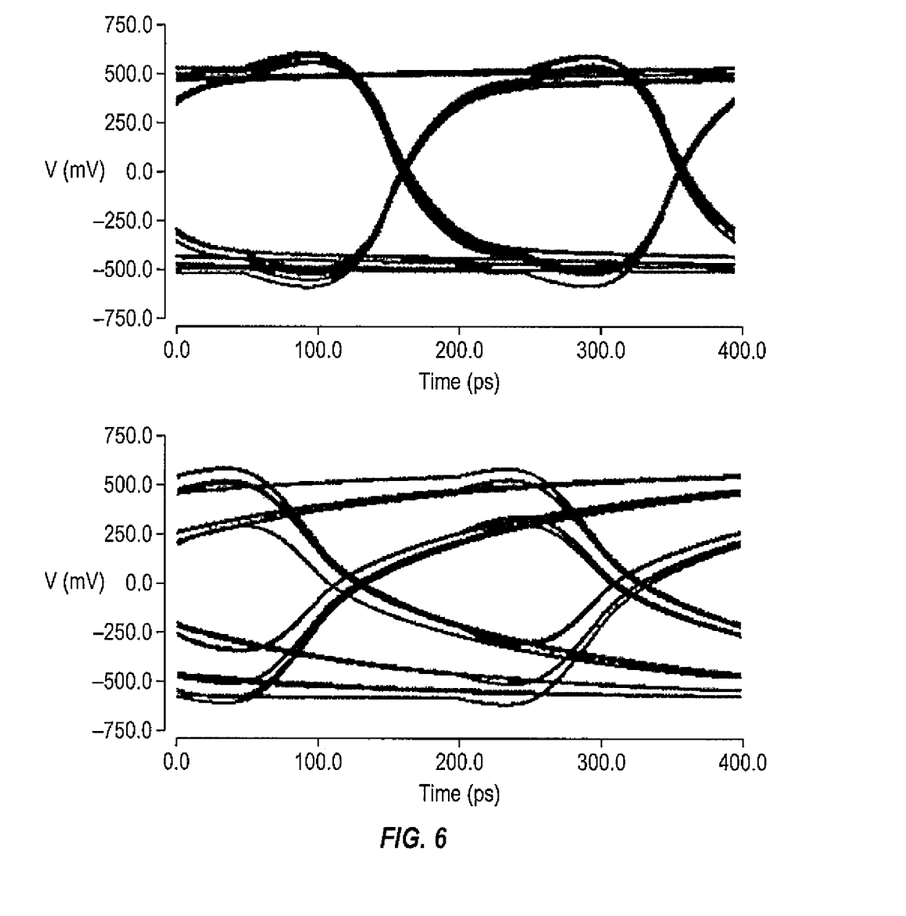
FIG. 6 illustrates eye diagrams comparing performance of a CML buffer of an embodiment of the present invention to performance of a Related Art CML buffer of a Comparative Example at a data rate of 5 gigabytes per second.

FIG. 3 illustrates a circuit diagram of a CML buffer that is referenced to a voltage source, according to an embodiment of the present invention.

Referring to FIG. 3, the voltage source-referenced CML buffer 20b of the present embodiment, like the CML buffer 20a described with respect to FIG. 2, has relatively quick rise and fall times that are achieved by providing low-resistance paths to a voltage source $V_{DD}$, and to a semi-constant voltage source having a voltage that is substantially equal to the desired final output voltage $V_{final}$. Here, $V_{final}$ is defined as $V_{low}$ (e.g., ground Gnd, or the low signal).

Like the voltage source-referenced CML buffer 10a of FIG. 1A, the CML buffer 20b of the present embodiment comprises a differential pair of input transistors (i.e., first input transistor 11a and second input transistor 11b) that are configured to receive respective input signals $i_p$ and $i_n$ at their respective inputs, first and second load resistors $R_{load\_1}$ and $R_{load\_2}$ respectively coupled in series with a total load capacitance (i.e., first load capacitance $C_{load\_1}$ and second load capacitance $C_{load\_2}$) and a differential pair of first and second outputs 13a and 13b respectively connected to first and second nodes N1 and N2 that are located between a respective one of the first and second input transistors 11a and 11b and a respective one of first and second load resistors $R_{load\_1}$ and $R_{load\_2}$.

However, unlike the voltage source-referenced CML buffer 10a of FIG. 1A, the voltage source-referenced CML buffer 20b of the present embodiment includes an current mirror transistor $M_{mirror}$ coupled to the voltage source $V_{DD}$, instead of including the tail current source 12 of current value $I_{dc}$. Additionally, the CML buffer 20b includes first and second PMOS transistors 14a and 14b, and first and second NMOS transistors 15a and 15b, which are implemented as switches with low on-resistance. However, it should be noted that the NMOS transistors 15a and 15b may be implemented as PMOS transistors, and that the PMOS transistors 14a and 14b may be implemented as NMOS transistors in other embodiments of the present invention. Additionally, the inputs of the first NMOS and PMOS transistors 14a and 15a are configured to receive the input signals $i_p$ that are sent to the first input transistor 11a, while the inputs of the second NMOS and PMOS transistors 14b and 15b are configured to receive the input signals $i_n$ that are sent to the second input transistor 11b. Further, the resistance of each of the first and second load resistors $R_{load\_1}$ and $R_{load\_2}$ may be, for example, about five times greater, or more, than the on-resistance of the PMOS transistors 14a and 14b and the NMOS transistors 15a and 15b. Additionally, each of first and second hold capacitors $C_{hold\_1}$ and $C_{hold\_2}$ has a first terminal coupled to ground, and a second terminal that is switchably coupled to a respective one of the first and second outputs 13a and 13b by a respective one of the first and second PMOS transistors 14a and 14b.

If the voltage of the "low" logic signal of the CML buffer 20b is referred to as $V_{final}$, two types of transitions of note for the CML buffer 20b include the transition from $V_{DD}$ to $V_{final}$ (e.g., a falling transition), and the transition from $V_{final}$ to $V_{DD}$ (e.g., a rising transition). A rising transition will be discussed with respect to the first output 13a.

Immediately before a beginning of the rising transition of the first output 13a, the first input transistor 11a and the first PMOS transistor 14a are turned on, while the first NMOS transistor 15a is turned off. Accordingly, the first output 13a is coupled to the first hold capacitor $C_{hold\_1}$ as a semi-constant voltage source, such that the output voltage of the first output 13a is equal to, or substantially equal to, $V_{final}$. Additionally, the second terminal of the first hold capacitor $C_{hold\_1}$ is coupled to ground Gnd through the first PMOS transistor 14a, the first input transistor 11a, and the current mirror transistor $M_{mirror}$, thereby causing the first hold capacitor $C_{hold\_1}$ to be discharged, thereby causing a voltage across the first hold capacitor $C_{hold\_1}$ to be very small (e.g., a voltage of about 0).

When the rising transition is initiated, an input signal $i_p$ causes the first PMOS transistor 14a and the first input transistor 11a to be turned off, and causes the first NMOS transistor 15a to be turned on. Accordingly, the first output 13a is coupled to the voltage source $V_{DD}$ through the low-resistance path of the first NMOS transistor 15a, causing the output voltage of the output signal $out_n$ at the first output 13a to rise from $V_{final}$ to $V_{DD}$. During the transition of the first output 13a from $V_{final}$ to $V_{DD}$, the effective resistance corresponding to the first output 13a is the on-resistance of the first NMOS transistor 15a, which is relatively low when compared to the resistance of the first output load resistor $R_{load\_1}$. Further, because the first hold capacitor $C_{load\_1}$ is blocked from the first output 13a by the open first PMOS transistor 14a, the effective capacitance at the first output 13a is substantially equal to the first load capacitance $C_{load\_1}$. Accordingly, a relatively large current is able to flow from the voltage source $V_{DD}$ to the first output 13a, and the transition time from $V_{final}$ to $V_{DD}$ is relatively fast.

Because of the differential structure of the CML buffer 20b, when the rising transition occurs with respect to the first output 13a, a falling transition occurs with respect to the other second output 13b. Accordingly, a falling transition (e.g., from $V_{DD}$ to $V_{final}$) will be described with respect to the second output 13b.

Like in the CML buffer 20a of FIG. 2, the second hold capacitor $C_{hold\_2}$ acts as a semi-constant voltage source. Accordingly, when the second PMOS transistor 14b is turned off, the second hold capacitor $C_{hold\_2}$ holds a voltage that is substantially equal to $V_{final}$. At a beginning of the falling transition, when the second PMOS transistor 14b is turned on, charge sharing occurs between the second load capacitance $C_{load\_2}$ and the second hold capacitor $C_{hold\_2}$ until the voltages across both are substantially equal. Because the on-resistance of the second PMOS transistor 14b is relatively low, charge sharing between the second load capacitance $C_{load\_2}$ and the second hold capacitor $C_{hold\_2}$ is able to occur relatively quickly.

While the voltages of the second load capacitance $C_{load\_2}$ and the second hold capacitor $C_{hold\_2}$ are equalized, the second terminal of the second load capacitance $C_{load\_2}$ is coupled to ground Gnd through the second input transistor 11b and the current mirror transistor $M_{mirror}$ and the second terminal of the second hold capacitor $C_{hold\_2}$ is coupled to ground Gnd through the second NMOS transistor, the second input transistor 11b, and the current mirror transistor $M_{mirror}$. Accordingly, both capacitors $C_{load}$ and $C_{hold\_2}$ may be discharged to $V_{final}$ (e.g., $V_{low}$). The voltage across the second load capacitance $C_{load\_2}$ as a result of the charge sharing is represented by $V_{load}$, which may be represented by the equation $V_{load}=\alpha V_{final}$, where $\alpha=C_{hold\_2}$ ($C_{hold\_2}+ C_{load\_2}$). Accordingly, an output voltage of the signal out$_p$ at the second output 13b reaches a value that is close to the final output voltage quickly. However, the time required for the second output 13b to reach $V_{final}$ from $\alpha V_{final}$ is relatively longer, due to the effective capacitance at the second output 13b of the CML buffer 20b being represented by $C_{load\_2}+C_{hold\_2}$. Thus, the transition from $V_{DD}$ to $\alpha V_{final}$ is relatively fast, while the transition from $\alpha V_{final}$ to $V_{final}$ is slower.

Accordingly, by providing low-resistance paths between the voltage source $V_{DD}$ and respective ones of the first and second outputs 13a and 13b, a rising time of the CML buffer 20b is comparatively improved. Similarly, by providing respective low-resistance paths between the first and second outputs 13a and 13b and a respective one the first and second hold capacitors $C_{hold\_1}$ and $C_{hold\_2}$ as semi-constant voltage sources, a falling time of the CML buffer 20b is comparatively improved.

Accordingly, the design of the CML buffers shown in FIGS. 2 and 3 each provide significantly shorter rise and fall times when compared to the Related Art CML buffers shown in FIGS. 1A and 1B, as demonstrated in FIGS. 4-7, which are described below.

FIGS. 4-7 illustrate eye diagrams comparing performance of a CML buffer of an embodiment of the present invention to performance of a Related Art CML buffer of a Comparative Example at different data rates.

Referring to FIGS. 4-7, in each of the figures, an eye diagram corresponding to a CML buffer according to an embodiment of the present invention is shown above an eye diagram corresponding to a Related Art CML buffer of the Comparative Example. In each eye diagram, the vertical axis corresponds to a measured signal amplitude (e.g., corresponding to the output signals outn and outp), and the horizontal axis corresponds to time.

Figure 7:
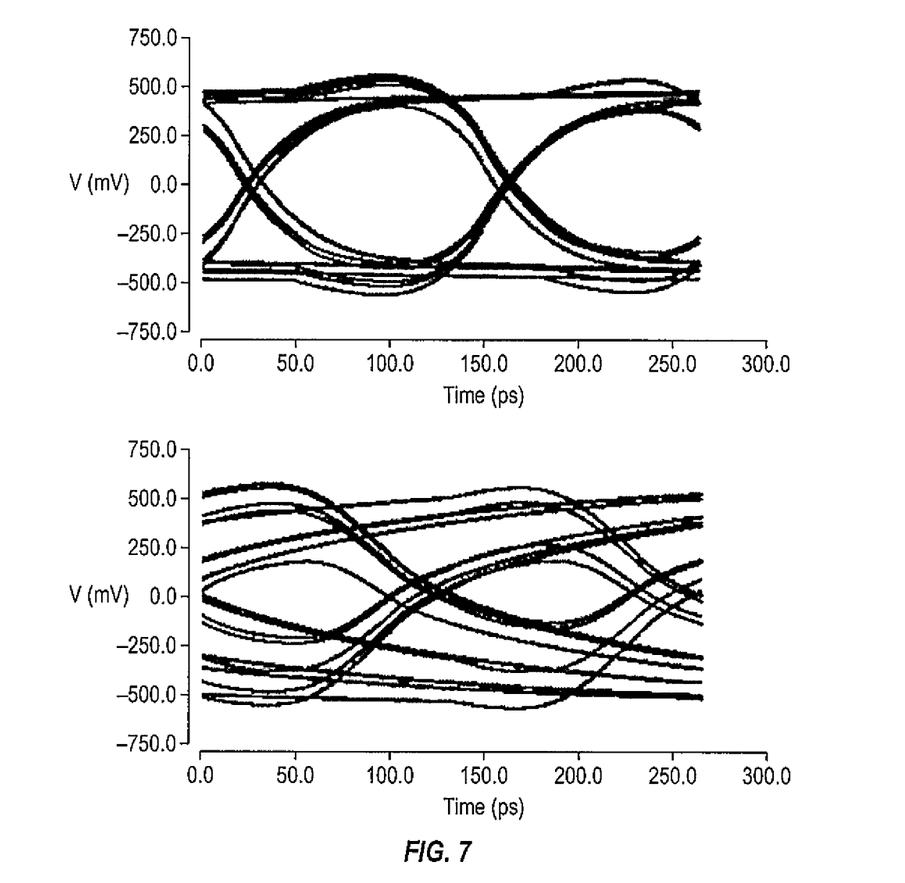
FIG. 7 illustrates eye diagrams comparing performance of a CML buffer of an embodiment of the present invention to performance of a Related Art CML buffer of a Comparative Example at a data rate of 7.5 gigabytes per second.

In the experiments used to generate the eye diagrams of FIGS. 4-7, a random bit stream was input to both the CML buffer of the present embodiment, and the Related Art CML buffer of the Comparative Example. The data rates used to produce they eye diagrams are 0.5 gigabytes per second (Gbps) in FIG. 4, 2.5 Gbps in FIG. 5, 5 Gbps in FIGS. 6, and 7.5 Gbps in FIG. 7. As can be seen in FIGS. 4-7, the rise and fall times of the CML buffer of the present embodiment is significantly better than the rise and fall times of the Related Art CML buffer. It may be further noted that performance of the CML buffer of the present embodiment is remarkably better than performance of the Related Art CML buffer at higher data rates (e.g., at a data rate of 7.5 Gigabytes per second, as shown in FIG. 7).

Accordingly, as described above, embodiments of the present invention provide a design for CML buffers with significantly shorter rise and fall times, and with remarkably improved performance at high data rates, when compared to a Related Art CML buffer, making the described CML buffers suitable for high-speed signal transmission and circuit interfacing.

While this disclosure has been described in connection with what is presently considered to be practical exemplary embodiments of the present invention, it is to be understood that the present invention is not limited to the disclosed embodiments, but, on the contrary, is intended to cover various suitable modifications and equivalent arrangements included within the spirit and scope of the appended claims and their equivalents.

What is claimed is:

1. A buffer, comprising:
   a differential pair of input transistors comprising a first input transistor and a second input transistor;
   a first output load resistor coupled in series with the first input transistor;
   a second output load resistor coupled in series with the second input transistor;
   a first output at a first node between the first output load resistor and the first input transistor;
   a second output at a second node between the second output load resistor and the second input transistor;
   a first hold capacitor configured to be switchably coupled to the first output to provide a semi-constant voltage source to the first output via a first low-resistance path; and
   a second hold capacitor configured to be switchably coupled to the second output to provide a semi-constant voltage source to the second output via a second low-resistance path.

2. The buffer of claim 1, further comprising:
   a first PMOS transistor as the first low-resistance path and coupled in parallel with the first output load resistor;
   a second PMOS transistor coupled in parallel with the second output load resistor;
   a first NMOS transistor having a first electrode coupled to the first node; and
   a second NMOS transistor as the second low-resistance path and having a first electrode coupled to the second node,
   wherein the first hold capacitor is coupled between a second electrode of the first NMOS transistor and ground,
   wherein the second hold capacitor is coupled between a second electrode of the second NMOS transistor and ground,
   wherein the first input transistor, the first PMOS transistor, and the first NMOS transistor are configured to receive a common first input signal, and
   wherein the second input transistor, the second PMOS transistor, and the second NMOS transistor are configured to receive a common second input signal.

3. The buffer of claim 2, wherein a first electrode of the first PMOS transistor is coupled to the first node,
   wherein a second electrode of the first PMOS transistor is coupled to ground,
   wherein a first electrode of the second PMOS transistor is coupled to the second node, and
   wherein a second electrode of the second PMOS transistor is coupled to ground.

4. The buffer of claim 2, wherein a first electrode of the first PMOS transistor is coupled to a first voltage source,
   wherein a second electrode of the first PMOS transistor is coupled to the first node,
   wherein a first electrode of the second PMOS transistor is coupled to the first voltage source, and
   wherein a second electrode of the second PMOS transistor is coupled to the second node.

5. The buffer of claim 2, wherein a first load capacitance is coupled in series to the first output load resistor, and
   wherein a second load capacitance is coupled in series to the second output load resistor.

6. The buffer of claim 1, further comprising a current mirror transistor between a first voltage source and the differential pair of input transistors.

7. The buffer of claim 1, wherein a first load capacitance is coupled in parallel to the first output load resistor, and wherein a second load capacitance is coupled in parallel to the second output load resistor.

8. The buffer of claim 1, further comprising a current mirror transistor between the differential pair of input transistors and ground.

9. The buffer of claim 1, wherein a resistance of each of the first output load resistor and the second output load resistor is at least about five times greater than an on-resistance of each of the NMOS and PMOS transistors.

10. The buffer of claim 1, wherein a first load capacitance is between the first node and ground, wherein a second load capacitance is between the second node and ground, and wherein a capacitance of each of the first and second hold capacitors is greater than a capacitance of each of the first and second load capacitances.

11. A method of controlling a current mode logic (CML) buffer, the method comprising:
turning on a first PMOS transistor and a first input transistor to electrically couple a first hold capacitor to a first voltage source;
charging the first hold capacitor to a voltage substantially equal to a final output voltage of a first output of the CML buffer through the first PMOS transistor and the first input transistor;
sharing a charge between the first hold capacitor and a first load capacitance through the first PMOS transistor; and
providing a first output voltage of a first value to the first output after the sharing of the charge.

12. The method of claim 11, further comprising:
turning on a second NMOS transistor during the turning on of the first PMOS transistor and the first input transistor; and
providing a second output voltage of a second value from a second voltage source to a second output of the CML buffer through the second NMOS transistor,
wherein a logical value of the second output voltage of the second value is opposite to a logical value of the first output voltage of the first value.

13. The method of claim 12, wherein the first voltage source is ground.

14. The method of claim 12, wherein the second voltage source is ground.

15. The method of claim 12, further comprising:
turning off the first input transistor and the first PMOS transistor;
turning on a first NMOS transistor coupled between a second voltage source and the first output of the CML buffer; and
providing the first output voltage of a second value from the second voltage source to the first output through the first NMOS transistor.

16. The method of claim 15, further comprising:
turning off the second NMOS transistor during the turning off of the first input transistor and the first PMOS transistor;
turning on a second PMOS transistor and a second input transistor during the turning on of the first NMOS transistor to electrically couple a second hold capacitor to the first voltage source;
charging the second hold capacitor to a voltage substantially equal to a final output voltage of the second output through the second PMOS transistor and the second input transistor;
sharing a charge between the second hold capacitor and a second load capacitance through the second PMOS transistor; and
providing the first output voltage of the first value to the second output after the sharing of the charge.

17. The method of claim 16, further comprising transmitting a first input signal to control the first PMOS transistor, the first input transistor, and the first NMOS transistor; and
transmitting a second input signal that is a logical complement of the first input signal to control the second PMOS transistor, the second input transistor, and the second NMOS transistor.

18. A current mode logic buffer comprising:
a first hold capacitor configured to receive a charge from a first voltage source through a first switch, and configured to share the charge with a first load capacitance through the first switch;
a second hold capacitor configured to receive a charge from the first voltage source through a second switch, and configured to share the charge with a second load capacitance through the second switch;
a third switch configured to couple a second voltage source to a first output of the CML buffer; and
a fourth switch configured to couple the second voltage source to a second output of the CML buffer,
wherein the first switch and the fourth switch are configured to be on when the second switch and the third switch are off.

19. The current mode logic buffer of claim 18, further comprising:
a first load resistor between the second voltage source and the first output; and
a second load resistor between the second voltage source and the second output.

20. The current mode logic buffer of claim 18, further comprising:
a first input transistor between the first voltage source and the first output; and
a second input transistor between the first voltage source and the second output.

* * * * *